United States Patent [19]
Leung

[11] Patent Number: 5,748,040
[45] Date of Patent: May 5, 1998

[54] FULLY DIFFERENTIAL HIGH GAIN CASCODE AMPLIFIER

[75] Inventor: Ka Yin Leung, Austin, Tex.

[73] Assignee: Crystal Semiconductor Corporation, Austin, Tex.

[21] Appl. No.: 749,383

[22] Filed: Nov. 6, 1996

Related U.S. Application Data

[63] Continuation of Ser. No. 503,312, Jul. 17, 1995, abandoned.

[51] Int. Cl.$^6$ .................................................... H03F 3/45
[52] U.S. Cl. .................................. 330/253; 330/261
[58] Field of Search ................................ 330/253, 258, 330/259, 261

[56] References Cited

U.S. PATENT DOCUMENTS

| | | | |
|---|---|---|---|
| 4,797,631 | 1/1989 | Hsu et al. | 330/253 |
| 4,933,643 | 6/1990 | Jandu | 330/9 |
| 4,965,468 | 10/1990 | Nicollini | 307/362 |
| 5,015,966 | 5/1991 | McIntyre | 330/253 |
| 5,146,179 | 9/1992 | Carley | 330/253 |
| 5,175,533 | 12/1992 | Krenik | 340/701 |
| 5,187,448 | 2/1993 | Brooks | 330/258 |
| 5,212,455 | 5/1993 | Pernici | 330/253 |
| 5,216,380 | 6/1993 | Carbou | 330/253 |
| 5,239,210 | 8/1993 | Scott | 307/355 |
| 5,281,924 | 1/1994 | Maloberti | 330/253 |
| 5,298,815 | 3/1994 | Brunolli | 307/530 |
| 5,361,040 | 11/1994 | Barrett | 330/253 |
| 5,392,003 | 2/1995 | Nag et al. | 330/254 |
| 5,420,540 | 5/1995 | Butler | 330/255 |
| 5,442,318 | 8/1995 | Badyal et al. | 330/253 |
| 5,465,072 | 11/1995 | Atarodi | 330/254 |

OTHER PUBLICATIONS

Ichiro Fujimori, Koichi Hamashita, and Eric J. Swanson, "A Fifth-Order Delta-Sigma Modulator with 110dB Audio-Band Dynamic Range," presented at the 93rd AES Convention, Oct. 1-4, 1992 in San Francisco.

"A High-Performance Micropower Switched-Capacitor Filter", Rinaldo Castello and Paul R. Gray, IEEE, J. Solid-State Circuits, vol. SC-20, No. 6, pp. 1122-1132, Dec. 1985.

"A CMOS Op Amp with Fully-Differential Gain Enhancement", Jennifer Lloyd and Hae-Seung Lee, 1994 IEEE 1057-7130, pp. 241-243.

Primary Examiner—Steven Mottola
Attorney, Agent, or Firm—Gregory M. Howison; J.P. Violette

[57] ABSTRACT

A very high gain cascode amplifier includes a cascoded differential structure wherein a cascoded N-channel leg comprised of two series connected transistors (56) and (58) are connected between an output node (30) and ground with a corresponding P-channel cascode leg comprised of series connected P-channel transistors (38) and (40) connected between node (30) and $V_{DD}$. Transistor (58) is connected to bias voltage, with transistor (56) having a gate thereof connected to a bias circuit (72) which provides gain thereto to increase the gain of a cascoded leg while not introducing any error into the amplifier. The bias circuit (72) has an imbedded structure that sets the gate voltage of transistor (56) to a voltage equal to one threshold voltage plus twice the $V_{on}$ voltage of transistors (56) and (58). This is achieved via negative feedback with transistors that track any errors, such that all errors are cancelled out and the maximum voltage swing is maintained for all operational characteristics of the cascoded leg.

26 Claims, 5 Drawing Sheets

FULLY DIFFERENTIAL HIGH GAIN CASCODE AMPLIFIER

This application is a Continuation, of application Ser. No. 08/503,312, filed Jul. 17, 1995, and now abandoned.

TECHNICAL FIELD OF THE INVENTION

The present invention pertains in general to fully differential amplifiers and, more particularly, to a cascode amplifier with a high swing output structure.

BACKGROUND OF THE INVENTION

A typical MOS amplifier is configured utilizing a MOS transistor which has the source/drain connected in series between ground and a current source or an active load. This is known as a common source configuration. The gain of this amplifier is approximately ($g_m r_o$) which has approximately a value of 30 for a submicron process. In order to increase the gain of this type of amplifier, a cascode configuration is utilized which is realized by disposing a second MOS transistor in series with the first MOS transistor and applying a bias to the gate thereof. The gain for this configuration is $(g_m r_o)^2$, which is equal to a value of approximately 900. This gain can be increased geometrically by disposing additional MOS devices in series with the second MOS device. However, the problem with this type of configuration is that the gain is realized by putting additional devices in series which reduces the overall swing of the amplifier. Also, the bias generator utilized to bias the multiple cascode devices is difficult to design.

In order to improve the operation of the cascode amplifier, the bias applied to the cascoded transistor is regulated. This is facilitated by utilizing an auxiliary amplifier such that the output thereof provides the drive to the gate of the cascoded transistor with the negative input thereof connected to the connection between the two series connected MOS transistors and the positive input thereof connected to a bias voltage. This will give an overall gain of $(g_m r_o)^2 A$ where A is the gain of the auxiliary amplifier. As such, an additional amount of gain can be obtained without adding more transistors in series.

One problem with the prior art structure utilizing a gain boosted bias configuration is that errors in the amplifier will be reflected in the $V_{on}$ voltage of the cascoded transistors proximate the power supply rail. Typically, in an amplifier configured with two transistors in a cascoded configuration, the output voltage is a minimum of $2 \times V_{on}$. However, errors in the amplifier will result in the minimum swing being altered. For low power supply voltages, this can create a problem.

If the $V_{ds}$ voltage level of either of the cascoded transistors varies from the $2V_{on}$ level of that transistor, this will degrade the operation of the amplifier. For example, if an error causes the gate voltage of the second cascoded transistor to decrease below $V_T + 2V_{on}$, the $V_{DS}$ voltage of the transistor closest to the power supply will decrease below $V_{on}$. When this happens, then the effective impedance falls, as the transistors enter the linear region, this reducing the gain of the amplifier. If, on the other hand, the gate voltage of the cascoded amplifier is increased due to an error, the voltage on the output will rise above $2V_{on}$ during full swing and decrease the output voltage at full swing.

SUMMARY OF THE INVENTION

The present invention disclosed and claimed herein comprises a cascoded differential amplifier. The differential amplifier includes first and second primary differential output legs that are connected between positive and negative power supply rails and each having a differential output. An input differential driving circuit is provided for receiving a differential input signal on positive and negative inputs and driving the first and second differential output legs. The first and second primary differential output legs each have a cascoded configuration with at least first and second primary cascoded transistors connected between said associated output and one of the power supply rails, with the first of the primary cascoded transistors being connected closest to the one of the power supply rails. Bias circuitry is provided for biasing the first and second primary cascoded transistors in such a manner that the first primary cascoded transistor is biased to provide a substantially constant $V_{on}$ voltage level across the source/drain thereof. A gain boost amplifier is provided for driving the gate of the second cascoded transistor to provide the bias voltage thereto and having a gain of A to multiply the output gain of the cascoded differential amplifier by A. The gain boost amplifier is a feedback amplifier with its input interfaced with the $V_{on}$ voltage level of the first primary cascoded transistor.

In another aspect of the present invention, the gain boost amplifier is a differential amplifier having a positive and negative differential input and a positive and negative differential output. The positive input is connected to the source/drain connection between the first and second primary cascoded transistors and the negative input of the gain boost amplifier is connected to a voltage substantially equal to the $V_{on}$ voltage of the first primary cascoded transistor. The negative output of the gain boost amplifier is connected to the gate of the second primary cascoded transistor. The gain boost amplifier is designed such that the differential output legs are substantially identical to the differential output legs of the cascoded differential amplifier such that all errors in the first primary cascoded transistor will be tracked in the gain boost amplifier. The voltage level on the negative input of the gain boost amplifier is derived from the $V_{on}$ voltage of a reference transistor configured similar to the first primary cascoded transistor and biased with the same gate bias voltage.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

Figure 1:
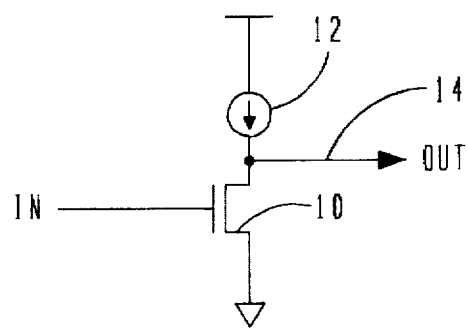
FIG. 1 illustrates a schematic diagram of a simple prior art amplifier.

Referring now to FIG. 1, there is illustrated a schematic diagram of a simple prior art amplifier which is comprised of an MOS transistor 10 having the source/drain path thereof connected between ground and a current source 12. The other side of the current source is connected to $V_{DD}$. The junction between the current source 12 and the source/drain path of transistor 10 provides the output on a terminal 14. The gate of transistor 10 comprises the input. The gain of this configuration is $(g_m r_o)$, which is approximately a value of "30" for typical submicron CMOS processes.

Figure 2:
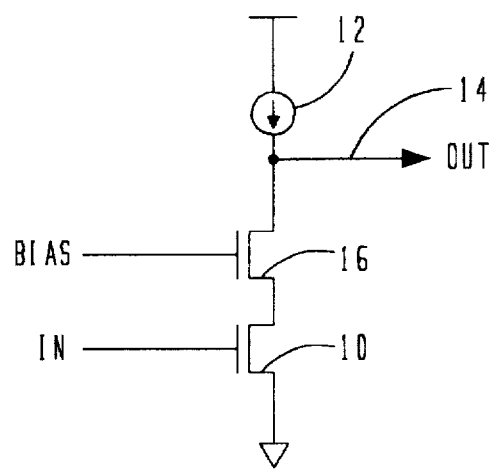
FIG. 2 illustrates a schematic diagram of a simple cascoded amplifier.

Referring now to FIG. 2, there is illustrated a schematic diagram of a simple cascoded amplifier of the prior art. The transistor 10 has the source/drain path thereof connected between ground and one side of the source/drain path of a transistor 16, the other side connected to the one side of the current source 12. The gate of transistor 16 is connected to a bias voltage. This configuration has a gain of approximately $(g_m r_o)^2$, which is approximately a value of "900." This gain can be increased by further cascoding transistors with additional bias voltages. However, this creates a "headroom" problem with respect to the output voltage swing.

Figure 3:
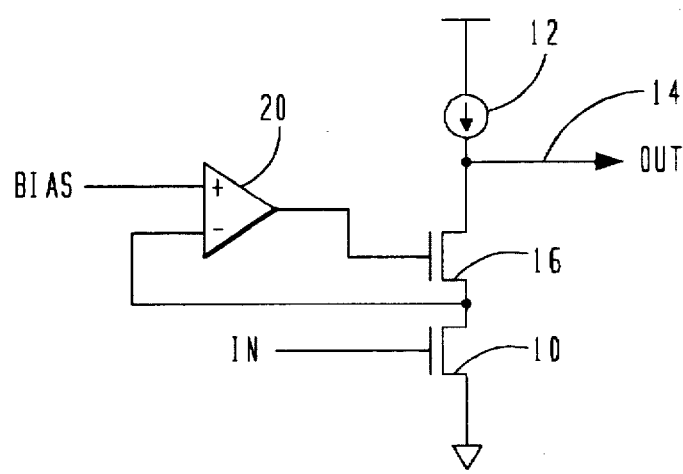
FIG. 3 illustrates a schematic diagram of a prior art gain boosted cascoded amplifier circuit.

Referring now to FIG. 3, there is illustrated a schematic diagram of a prior art cascoded amplifier using a gain boosted bias. The transistor 16 has the gate thereof connected to the output of an amplifier 20, with the negative input connected to the junction between the source/drain paths of transistors 10 and 16 and the positive input thereof connected to the bias voltage. This provides an equivalent of the gain enhancement without further cascading. If the gain of the amplifier 20 is "A" the gain of the overall amplifier is approximately $(g_m r_o)^2 A$. The voltage swing on the output terminal 14 can be biased to the sum of the $V_{on}$ voltages of the two transistors 10 and 16. In order to insure that these voltages provide the minimum swing for the amplifier, it is important to insure that the gate drive voltage for transistor 16 is at the correct bias voltage. This should be set to a voltage of $V_T+2V_{on}$. However, if an error is introduced into the drive to the gate of the transistor 16 by the amplifier 20, this voltage will be $V_T+2V_{on}+e$ where "e" represents the error introduced by the amplifier 20.

Figure 4:
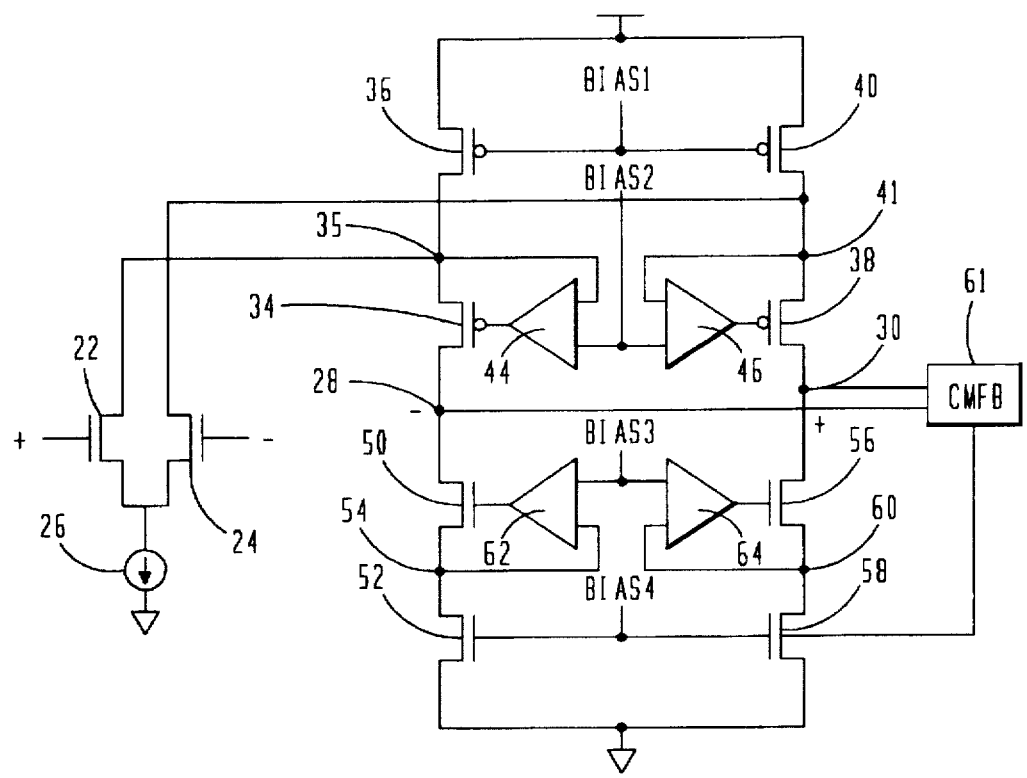
FIG. 4 illustrates a schematic diagram of a prior art fully differential gain boosted cascoded amplifier.

Referring now to FIG. 4, there is illustrated a prior art fully differential amplifier using the gain boosted bias circuitry in a cascoded configuration. A first differential pair of transistors 22 and 24 are connected in a common source configuration with the common source connection input to a current source 26, the other side thereof connected to ground. The other side of the source/drain path of transistor 22 is connected to a node 35 and the other side of the source/drain path of transistor 24 is connected to a node 41. The gate of transistor 22 is connected to a positive input signal and the gate of transistor 24 is connected to a negative output signal.

One side of the source/drain path of a transistor 34 is connected to a node 28, the inverting output, the other side thereof connected to a node 35 and one side of the source/drain path of a transistor 36, transistors 34 and 36 being P-channel transistors. The other side of the source/drain path of transistor 36 is connected to $V_{DD}$. A similar configuration is connected to node 30, the noninverting output, wherein two P-channel transistors 38 and 40 are connected in series with the source/drain path of transistor 38 connected between node 30 and node 41, node 41 connected to one side of the source/drain path of transistor 40, the other side thereof connected to $V_{DD}$. The gates of transistors 36 and 40 are connected to a bias signal BIAS1. The gate of transistor 34 is connected to the output of an amplifier 44, the positive input thereof connected to node 35 and the negative input thereof connected to a bias signal BIAS2. Similarly, the gate of transistor 38 is connected to the output of an amplifier 46, the positive input thereof connected to the node 41 and the negative input thereof connected to the bias signal BIAS2.

Node 28 is connected to a N-channel leg which is comprised of two series connected N-channel transistors 50 and 52. The source/drain path of transistor 50 is connected between node 28 and a node 54, with the source/drain path of transistor 52 connected between node 54 and ground. Node 30 is similarly connected through two series N-channel transistors 56 and 58 to ground, with the source/drain path of transistor 56 connected between node 30 and a node 60, transistor 58 having the source/drain path thereof connected between node 60 and ground. The gates of transistors 52 and 58 are connected to a bias signal BIAS4. The gate of transistor 50 is connected to the output of an amplifier 62, the positive input thereof connected to the bias signal BIAS3 and the negative input thereof connected to the node 54. The gate of transistor 56 is connected to the output of an amplifier 64, the negative input thereof connected to the node 60 and the positive input thereof connected to the bias signal BIAS3. The fully differential structure of FIG. 4 has the same problems of the prior art amplifier of FIG. 3 in that the error generated by the amplifiers 44, 46, 62 and 64 is not compensated for and it will be introduced into the $V_{on}$ voltages of the various cascoded transistors. BIAS4 is connected to a common-node feedback structure 61. More specifically, if the voltage level of BIAS3 for amplifiers 62 and 64 differs from the $V_{on}$ voltage of either of the transistors 52 or 58, then the drive to the respective transistors 50 and 56 will have an error introduced therein and this error will be reflected in the $V_{ds}$ voltages of transistors 52 and 58. If the $V_{ds}$ voltage decreases, this indicates that the transistor is driven into the linear region, this reducing the resistance $r_o$ and, consequently the gain. If the $V_{ds}$ voltage rises above $V_{on}$, their full voltage swing will be impeded.

Figure 5:
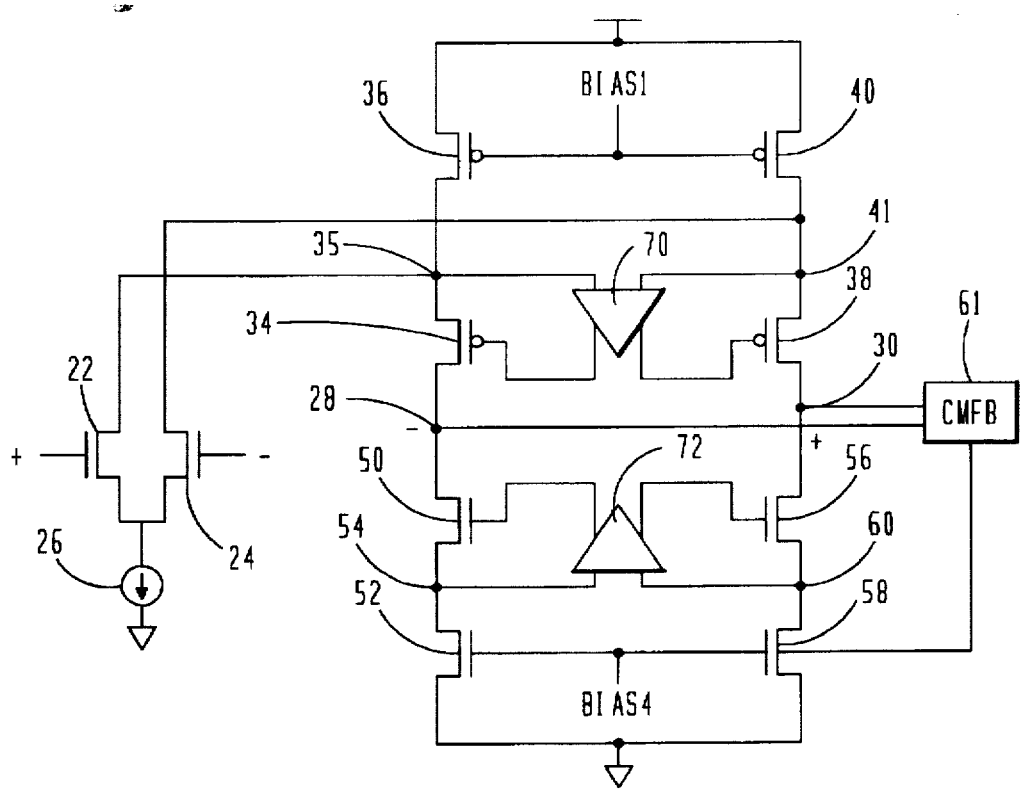
FIG. 5 illustrates a schematic diagram of the preferred embodiment of the gain boosted cascoded amplifier of the present invention.

Referring now to FIG. 5, there is illustrated a schematic diagram of the preferred embodiment of the high gain cascoded amplifier, wherein like parts in the various figures correspond to like numerals with respect to FIGS. 4 and 5. The exception is that the amplifiers 44, 46, 62 and 64 are not utilized to drive the gates of transistors 34, 38, 50 and 56, respectively. Rather, a biased amplifier circuit 70 is provided for biasing the gates of transistors 34 and 38 and a biased amplifier circuit 72 is provided for biasing the gates of transistors 50 and 56. Biasing circuit 70 has two differential inputs connected to nodes 35 and 41 respectively and two differential outputs for driving the gates of transistors 34 and 38. Similarly, biasing circuit 72 has two differential inputs connected to the nodes 54 and 60, respectively and two differential outputs connected to the gates of transistors 50 and 56, respectively. Each of the differential biasing circuits 70 and 72 is operable to set the voltage at each of the gates at the level of $V_T+2V_{on}$ where this value will track with the $V_T+2V_{on}$ value of the bias circuit. As will be described in more detail hereinbelow, any errors in the cascoded output legs will be tracked in the associated differential biasing circuits such that they will cancel out and, therefore, the voltage on the gates of transistors 56 and 50, and 34 and 38 will be maintained at the level $V_T+2V_{on}$ relative to either ground or $V_{DD}$ and the $V_{ds}$ voltage of transistors 52 and 58, and 36 and 40 will be maintained at the respective $V_{on}$ voltage level.

Figure 6:
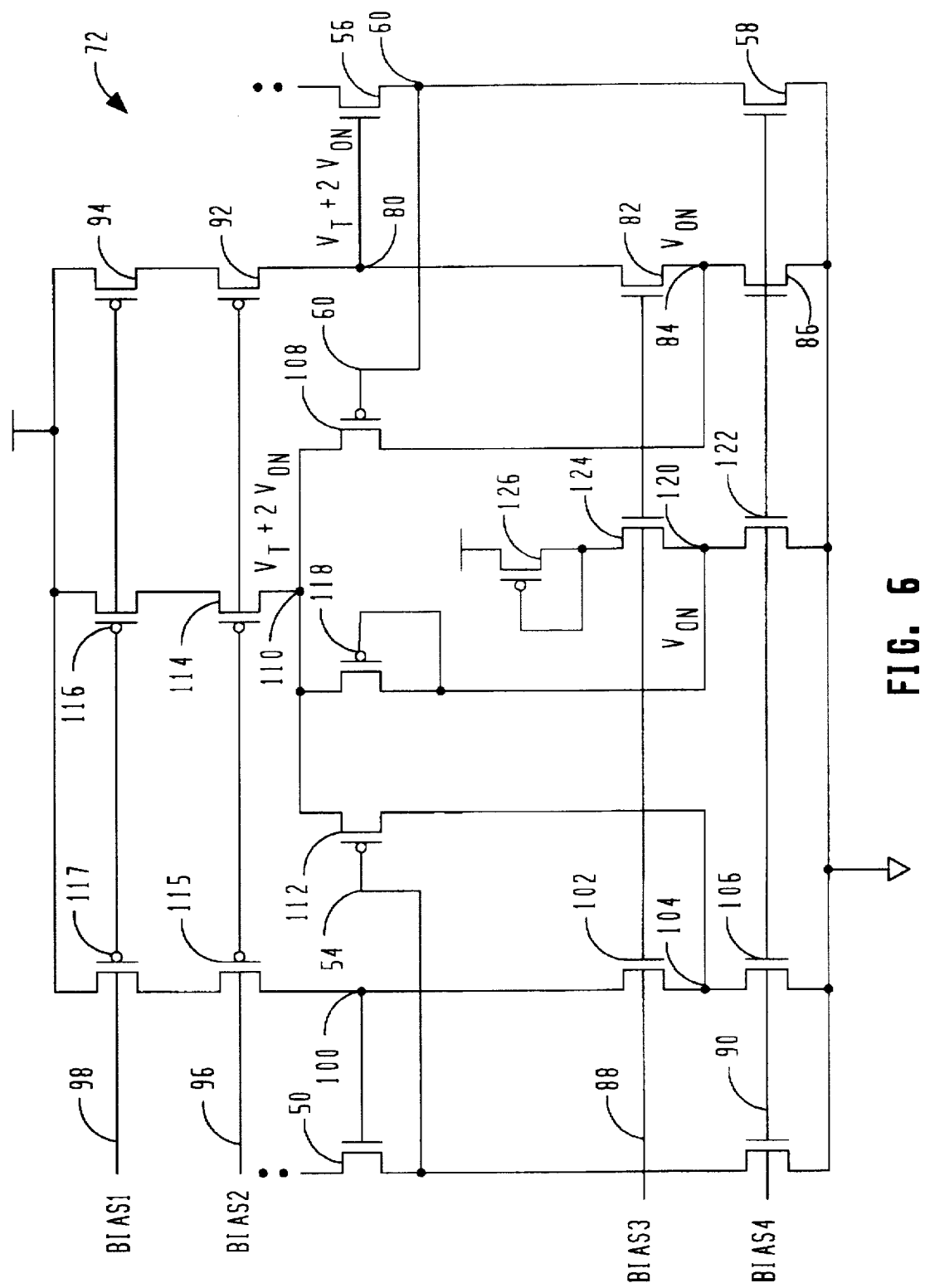
FIG. 6 illustrates a schematic diagram of the imbedded $V_{on}$ bias circuit.

Referring now to FIG. 6, there is illustrated a schematic diagram of bias circuit 72. The output of the bias circuit 72 connected to the gate 56 is provided on a node 80. Node 80 is connected to one side of the source/drain path of an N-channel transistor 82, the other side thereof connected to a node 84. Node 84 is connected to one side of the source/ drain path of an N-channel transistor 86, the other side thereof connected to ground. The gate of transistor 82 is connected to a bias circuit (not shown) on a line 88. The gate of transistor 86 is connected to an external bias circuit (not shown) through a line 90. Node 80 is also connected to one side of the source/drain path of a P-channel transistor 92, the other side thereof connected to one side of the source/drain path of a P-Channel transistor 94, the other side of the source/drain path of transistor 94 connected to $V_{DD}$. The gate of transistor 92 is connected to an external bias circuit (not shown) on a line 96. The gate of transistor 94 is connected to an external bias circuit (not shown) on a line 98.

In a similar manner, the other output of bias circuit 72 is provided on a node 100 to drive the gate of transistor 50. Node 100 is connected to one side of the source/drain path of an N-channel transistor 102, the other side thereof connected to a node 104. Node 104 is connected to one side of the source/drain path of an N-channel transistor 106, the other side thereof connected to ground. The gate of transistor 102 is connected to line 88 and the gate of transistor 106 is connected to line 90 to receive bias therefor. The node 84 is connected to one side of the source/drain path of a P-channel transistor 108, the other side thereof connected to a node 110 and the gate thereof connected to the node 60 comprising one of the inputs to the bias circuit 72. The node 104 is connected to one side of the source/drain path of a P-channel transistor 112, the other side thereof connected to node 110 and the gate thereof connected to the node 54 which comprises the other input to the bias circuit 72.

Node 110 is connected to one side of the source/drain path of a P-channel transistor 114, the other side thereof connected to one side of the source/drain path of a P-channel transistor 116. The other side of the source/drain path of transistor 116 is connected to $V_{DD}$. The gates of transistor 114 and 116 are connected to bias lines 96 and 98 respectfully. Node 110 is also connected through a connected P-channel transistor 118 having the drain and gate connected together, one side of the source/drain path thereof connected to node 110 and the other side thereof connected to a node 120, the gate of transistor 118 connected to node 120. Node 120 is connected to one side of the source/drain path of an N-channel transistor 122, the other side thereof connected to ground and the gate thereof connected to the bias line 90. Node 120 is also connected to one side of an N-channel transistor 124, the other side thereof connected to both the gate and one side of the source/drain path of diode-connected P-channel transistor 126. The other side of the source/drain path of transistor 126 is connected to $V_{DD}$ and a gate of transistor 124 is connected to the bias line 88. In operation, the voltage on node 84 is the $V_{on}$ of transistor 86 which is set by the bias on line 90. Additionally, the voltage on node 60 is the $V_{on}$ voltage of the transistor 58. The voltage on node 110 is $V_T$ plus the sum of the $V_{on}$ voltage on the line 60 and the $V_{on}$ voltage on the node 84. Since the transistors are manufactured identical, the $V_{on}$ voltage on node 84 is the same as the $V_{on}$ voltage on node 60. Therefore, the voltage on node 100 is $V_T+2V_{on}$. Further, the diode configured transistor is connected to node 120 which will also result in the same voltage drop, since the gate-to-source voltage $V_{GS}$ is equal to $V_T+V_{on}$.

It is noted that P-channel transistor 108 supplies current to node 84. Therefore, the voltage across transistor 82 increases until the voltage on line 80 is at a voltage $V_T+2V_{on}$ which will occur when voltage on node 60 is the $V_{on}$ voltage of transistor 58. Therefore, it can be seen that this is a substantial replica of the output differential circuit wherein the $V_{on}$ voltage of transistor 86 at node 84 will be forced equal to the $V_{on}$ voltage of transistor 58 at node 60, this being achieved only when the voltage on node 80 is $V_T+2V_{on}$. It is noted that this is also the case with respect to node 100 and the voltage associated therewith on the node 104. This will not be described in detail.

It is noted that if there is an error that exists in the $V_{on}$ voltage of transistor 58, this error will also be replicated in the bias circuit 72. However, this is a negative feedback, and therefore, the error will be canceled out as the bias circuit "tracks" any errors. Therefore, the voltage on the node 30 at the minimum swing will be set equal to $2V_{on}$ from $V_{DD}$ or ground.

Figure 7:
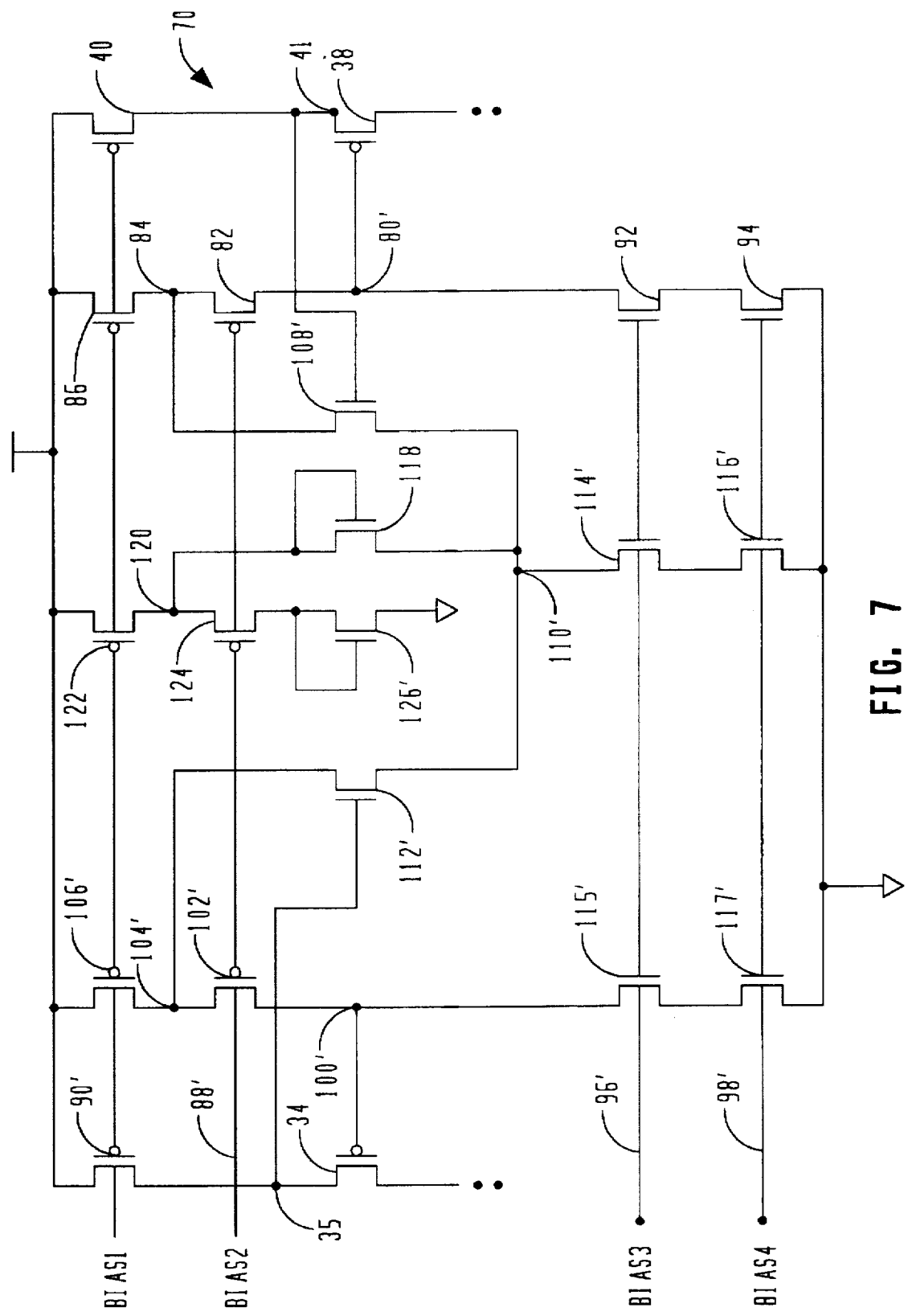
FIG. 7 illustrates the imbedded $V_{on}$ amplifier for the mirrored P-channel configuration.

Referring now to FIG. 7, there is illustrated a schematic diagram of the bias circuit 70 which is the image circuit of the bias circuit 72 and all reference numerals indicated with primes wherein P-channel transistors and the bias circuit 70 correspond to N-channel transistors in bias circuit 72 and N-channel transistors in bias circuit 70 correspond to P-channel transistors in bias circuit 72. Also, all connections to $V_{DD}$ are inverted and are connected to ground with all ground connections connected to $V_{DD}$ in bias circuit 70.

Figure 8:
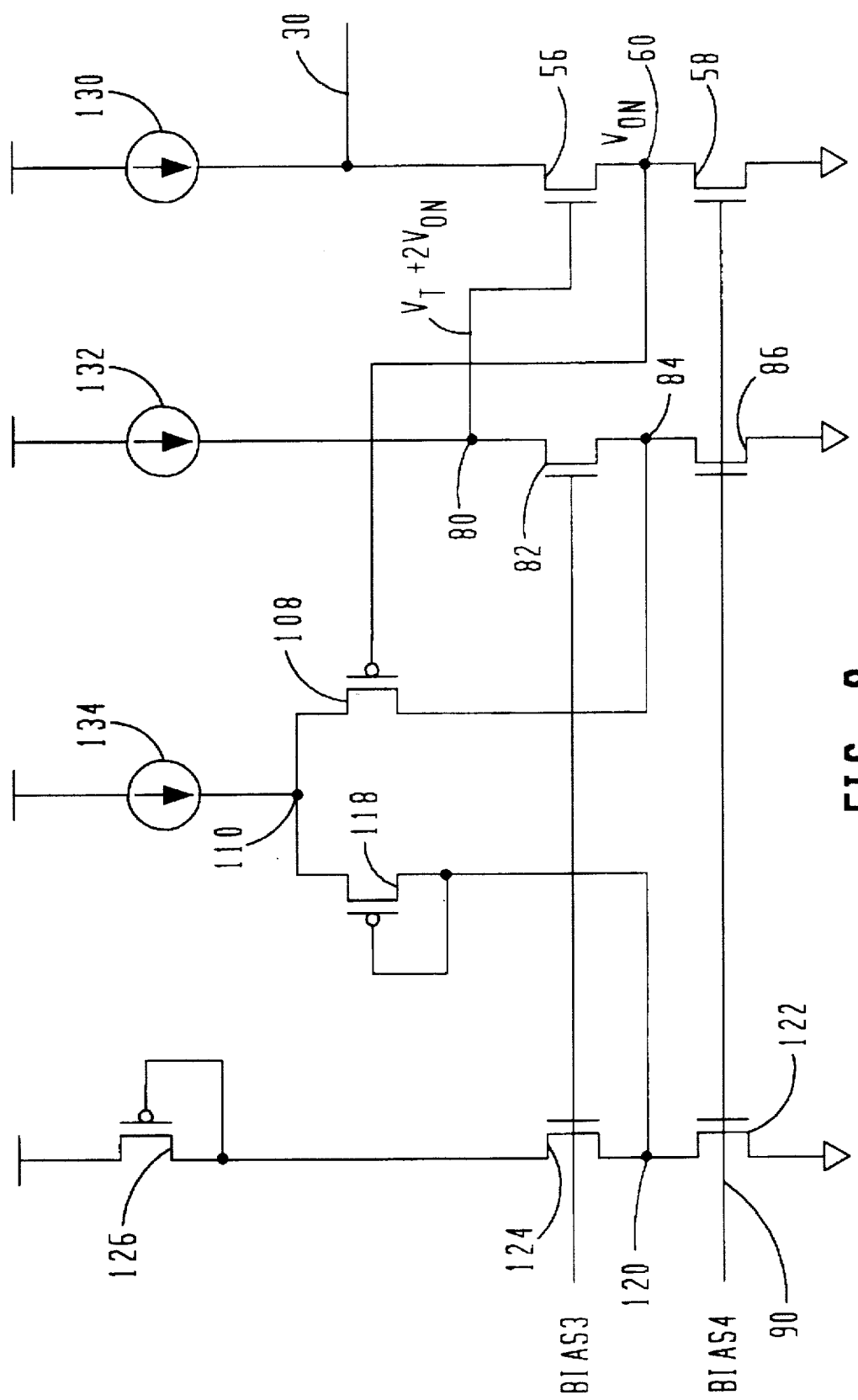
FIG. 8 illustrates a detail of the imbedded bias circuit of FIG. 6.

Referring now to FIG. 8, there is illustrated a schematic diagram of the imbedded bias circuit illustrated in FIG. 6, depicting a simplified view thereof for illustrative purposes. In the circuit of FIG. 8, the transistors 40 and 38 have been replaced by a current source 130, transistors 92 and 94 have been replaced by current source 132 and transistors 114 and 116 have been replaced by current source 134. The other side of the differential leg comprised of transistors 102, 106, 115 and 117 is not illustrated.

In the structure of FIG. 8, it can be seen that the differential amplifier 72 is basically comprised of a portion that drives the output node 80 and a portion that drives the output node 100 (not shown). Only the portion that drives the output node 80 is illustrated. In this configuration, the output differential leg is that comprised of the current source 132 and the output transistors 82 and 86. The other side of this differential amplifier can be considered to be the transistors 126, 124 and 122. It is noted that transistors 122, 86 and 58 are all biased by the bias voltage BIAS4. The input differential circuit is comprised of the two transistors 108 and 118 and the current source 134, connected in a common source configuration. In this mode, one input to the overall differential amplifier will be moved to the voltage $V_{on}$ on node 60. The output of the amplifier, as described above, is on the node 80 and comprises the voltage $V_T+2V_{on}$. In order for this relationship to exist, the voltage $V_{on}$ on node 60 must be the same as the voltage on node 84 and also on node 120. Since the transistor 118 is connected in a diode-configured manner, then the second input of the differential amplifier comprised of transistors 108 and 118 will be the voltage $V_{on}$. The amplifier will always attempt to maintain the voltage on the input to transistor 108 equal to the voltage on the input to transistor 118. Since the transistor 122 is matched to the transistor 158 and the transistor 58 is also matched to transistor 86 and the bias for transistors 122, 86 and 58 is the same, any errors that occur in the transistor 122 or the transistor 86 will be reflected to the output on node 80. This is due to the fact that the bias signal BIAS4 on the node 90 and BIAS3 set the voltage on node 84 and on node 88 at $V_{on}$ and also the voltage of node 120 at $V_{on}$. If something occurred on node 80 to cause transistor 56 to turn off slightly, this would cause node 60 to respond in a negative manner, pulling the gate of transistor 108 down and causing more current to go in node 84 which would cause node 84 to go up, pushing node 80 up in voltage, i.e., this providing negative feedback. Therefore, the gain boosted amplifier driving the gate of transistor 56 will always seek an output level of $V_T+2V_{on}$, and therefore the voltage on node 60 will be at a voltage level $V_{on}$. This is due to the fact that the differential amplifier that provides the gate drive to transistor 56 receives on one input thereof the voltage $V_{on}$ on node 60 and on the other input thereof a corresponding voltage that is derived from substantial the same transistor with substantially the same bias. Therefore, any errors in the amplifier will only be errors that exist in the transistor 58 and, therefore, the errors will "track", since transistors 58, 86 and 122 are substantially identical with the same bias.

In addition to utilizing a single stage gain boost amplifier, a second stage of gain boost could be added. For example, in FIG. 6, the gate drive to transistor 82 and the gate drive to transistor 92 and corresponding transistors 102 and 115 could be provided by another gain boost amplifier. This would be configured substantially the same as the structures of FIG. 6 and FIG. 7 and would operate the same. This would increase the gain without reducing the head room on the output differential legs. All N-channel transistors having one side of the source/drain path thereof connected to ground would be biased from the same bias voltage BIAS4 and all P-channel transistors having one side of the source/drain path thereof connected to $V_{DD}$ all would have all the gates thereof connected to the bias signal BIAS1.

In summary, there has been provided a gain boost cascoded differential amplifier. Each of the output differential legs has two cascoded transistors disposed on each side of the output node with the cascode transistor closest the power supply rail biased to a $V_{on}$ voltage and the transistor closest the output node gain boosted by a gain boost differential amplifier. The gain boost differential amplifier has one input thereof connected to the $V_{on}$ voltage and the other input thereof connected to a voltage substantially identical to $V_{on}$.

Although the preferred embodiment has been described in detail, it should be understood that various changes, substitutions and alterations can be made therein without departing from the spirit and scope of the invention as defined by the appended claims

What is claimed is:

1. A cascoded differential amplifier, comprising:

first and second differential output legs connected between positive and negative power supply rails and each having an output;

an input differential driving circuit for receiving a differential input signal and driving said first and second differential output legs;

said first and second differential output legs having a cascoded transistor configuration with at least first and second primary cascoded transistors in each of said first and second differential output legs connected between said associated output and one of said power supply rails with said first primary cascoded transistor having the source/drain path thereof connected between said associated power supply rail and a voltage node and said second primary cascoded transistor having the source/drain path thereof connected between said voltage node and said associated output; and bias circuitry for biasing said first and second primary cascoded transistors, said first primary cascoded transistor biased to a substantially $V_{on}$ voltage level, with said substantially $V_{on}$ voltage level being substantially the $V_{on}$ voltage of said first primary cascoded transistor and said second primary cascoded transistor being gain boosted with a gain boost differential amplifier driving the gate thereof with a gain of $-A$ to multiply the output gain of the cascoded differential amplifier by the gain of $-A$, said gain boost differential amplifier having positive and negative differential inputs with the negative input thereof connected to said voltage node and the positive input thereof connected to a voltage that is substantially identical to the voltage on said voltage node, said gain boost differential amplifier connected in a negative feedback configuration.

2. The differential amplifier of claim 1, wherein any errors in said gain boost differential amplifier will track errors in said first primary cascoded transistor.

3. The differential amplifier of claim 1, wherein said gain boost differential amplifier comprises:

a differential amplifier having first and second differential legs associated with positive and negative outputs, respectively, each of said first and second differential legs having a cascoded configuration with each having at least first and second secondary cascoded transistors connected in a cascode configuration with said first secondary cascoded transistor connected between a second voltage node and one of said power supply rails and said second secondary cascoded transistor connected between said second voltage node and the respective output; and a differential input circuit having a differential pair of transistors of the opposite conductivity type of said first and second secondary cascoded transistors to provide the positive and negative inputs of said differential gain boost amplifier for driving said second voltage nodes on each of said first and second differential legs of said gain boost differential amplifier, with the negative one of said differential inputs connected to said first voltage node, and the positive output of said gain boost differential amplifier connected to the gate of said second primary cascoded transistor, and the negative input connected to the one of said second voltage nodes associated with the negative output and wherein said first secondary cascoded transistor in each of said differential legs for said gain boost differential amplifier are connected to the same bias as said first primary cascoded transistor.

4. The differential amplifier of claim 1, wherein the positive differential input of said gain boost differential amplifier that is connected to a voltage substantially equal to the voltage on said first voltage node is connected to a voltage derived from a transistor having a source/drain path thereof connected between a second voltage node and the one of said power supply rails associated with said first primary cascoded transistor and biased in the same manner as said first primary cascoded transistor.

5. A cascoded differential amplifier for receiving a differential input signal with positive and negative differential inputs and providing positive and negative differential outputs, comprising:

primary positive and negative differential output legs connected between positive and negative power supply rails for providing the positive and negative differential outputs, respectively;

each of said primary positive and negative differential output legs having at least n-primary cascoded transistors disposed between the associated differential output and one of said positive and negative power supply rails, n being an integer;

a gain boost amplifier associated with each of said differential output legs for biasing the gate of the mth one of said n-primary cascoded transistors as determined from the one of said power supply rails in each of said differential output legs, m being an integer and less than n with the input of said gain boost amplifier connected to a first voltage node on the drain of one of the m primary cascoded transistors such that a negative feedback path is provided; and bias circuitry for biasing the m primary cascoded transistors such that, with said gain boost amplifier, the voltage on said first voltage node is equal to the sum of the substantially $V_{on}$ voltages for the ones of said m primary cascoded transistors between said first voltage node and the one of said associated power supply rails.

6. The differential amplifier of claim 5, wherein said gain boost amplifier is operable to track errors in said m primary cascoded transistors disposed between said first voltage node and said negative power supply rail.

7. The differential amplifier of claim 5, wherein said gain boost amplifier comprises a differential gain boost amplifier with positive and negative differential inputs and positive and negative differential outputs, said negative differential input connected to said first voltage node having a voltage output equal to the sum of the $V_{on}$ voltage of said m primary cascoded transistors disposed between said first voltage node and said negative power supply rail, said positive input of said differential gain boost amplifier connected to a reference voltage substantially equal to the sum of the $V_{on}$ voltages of said m primary cascoded transistors disposed between said first voltage node and said negative power supply rail, and the positive output of the differential gain boost amplifier connected to the gate of the nth one of the n-cascoded transistors wherein the reference voltage will also substantially track all errors in said primary cascoded transistors disposed between said first voltage node and said negative power supply rail.

8. The differential amplifier of claim 7, wherein said differential gain boost amplifier has secondary positive and negative differential output legs with n-secondary cascoded transistors disposed therein which are substantially identical to the n-primary cascoded transistors in said primary positive and negative differential output legs, wherein the bias for m of said secondary cascoded transistors disposed between said nth secondary cascoded transistor and said negative power supply rail is substantially identical to the gate bias applied to each of said m primary cascoded transistors disposed between said first voltage node and said negative power supply rail.

9. The differential amplifier of claim 8, wherein the negative input of said differential gain boost amplifier is connected to the source/drain connection between the nth one of said cascoded transistors in the negative one of said secondary differential output legs and the m secondary cascoded transistors associated therewith disposed between said nth secondary cascoded transistor and said negative power supply rail such that the input voltage is the sum of the $V_{on}$ voltages of the m transistors disposed between said nth secondary cascoded transistor and said negative power supply rail.

10. The differential amplifier of claim 5, wherein n is equal to two and m is equal to 1.

11. A cascoded differential amplifier for receiving a differential input signal with positive and negative differential inputs and providing positive and negative differential outputs, comprising:

primary positive and negative differential output legs connected between positive and negative power supply rails for providing the positive and negative differential outputs, respectively;

each of said primary positive and negative differential output legs having at least first and second series connected cascoded transistors disposed between the associated differential output and one of said positive and negative power supply rails, such that said first cascoded transistor in each of said primary positive and negative differential output legs has one side of the source/drain path thereof connected to said one power supply rail;

a gain boosted amplifier associated with said primary positive and negative differential output legs and having first and second negative inputs and first and second positive outputs, said first negative input connected to a voltage node between the source/drain paths of said first and second cascoded transistors in said primary positive differential output leg and said second negative input connected to a voltage node between said source/drain paths of said first and said second cascoded transistors in said primary negative differential output leg, with said first positive output driving the gate of said second cascoded transistor in said primary positive differential output leg and said second positive output driving the gate of said second transistor and said primary negative output leg, said gain boosted amplifier having an internal reference which forces said voltage nodes in said primary positive and negative differential output legs to substantially the $V_{on}$ voltage for said associated first cascoded transistor; and bias circuitry for said gain boosted amplifier and said first cascoded transistors in said primary positive and negative output legs that biases said voltage nodes in said primary positive negative differential output legs to substantially the associated $V_{on}$ voltage in association with the operation of said gain boosted amplifier.

12. The cascoded differential amplifier of claim 11, wherein said gain boosted amplifier comprises:

first and second positive output legs for providing said first and second positive outputs to drive the gates of said second transistors in said primary positive and negative output legs, each of said first and second positive output legs having first and second cascoded transistors with the source/drain paths thereof connected in series with said associated first cascoded transistor having one side of the source/drain path thereof connected to said one power supply rail with a voltage node formed between each of said first and second cascoded transistors in each of said first and second positive output legs;

a common negative output leg having first and second cascoded transistors with the source/drain paths thereof connected in series with a voltage node disposed therebetween, with said first cascoded transistor having one side of the source/drain path thereof connected to ground and a current source feeding said first and second cascoded transistors in said common negative output leg;

an input driving structure for driving current into said voltage nodes associated with said first and second positive output legs and said common negative output leg, said input structure having first and second negative inputs for driving current into said voltage nodes on said first and second positive output legs inversely to the voltage on said voltage nodes on said primary positive and negative differential output legs respectively, said input structure having a common positive input for driving current into said voltage node on said common negative output leg inversely to the voltage thereon, the voltage thereon substantially equal to the voltage on said voltage node associated with said primary positive and negative output legs; and said bias circuitry for biasing said first transistors in said first and second positive output legs and said common negative output leg in addition to said first transistors in said primary positive and negative output legs.

13. The cascoded differential amplifier of claim 12, wherein said common positive input comprises a transistor of opposite type to said first transistors in said common output leg with the gate thereof connected to said voltage node in said common negative output leg.

14. The differential amplifier of claim 1, wherein said gain boost differential amplifier includes first and second cascoded differential legs with associated positive and negative outputs with said cascoded operation biased with said bias circuitry to provide a common bias between said first and second primary cascoded transistors and said gain boost differential amplifier.

15. The differential amplifier of claim 14, wherein said gain boost differential amplifier includes a differential input circuit and includes a common mode feedback circuit for controlling said bias circuitry on the input of said gain boost differential amplifier.

16. The differential amplifier of claim 14, wherein said gain boost differential amplifier has at least one transistor disposed therein that is biased to substantially its $V_{on}$ voltage, which substantially $V_{on}$ voltage of said at least one transistor in said gain boost differential amplifier is substantially equal to said substantially $V_{on}$ voltage level of said first primary cascoded transistor, which said $V_{on}$ voltages are controlled by said bias circuitry, such that they track each other for all process variations.

17. The differential amplifier of claim 5, wherein said gain boost differential amplifier includes first and second cascoded differential legs with associated positive and negative outputs with said cascoded operation biased with said bias circuitry to provide a common bias between said first and second primary cascoded transistors and said gain boost differential amplifier.

18. The differential amplifier of claim 17, wherein said gain boost differential amplifier includes a differential input circuit and includes a common mode feedback circuit for controlling said bias circuitry on the input of said gain boost differential amplifier.

19. The differential amplifier of claim 11, wherein said gain boosted amplifier includes first and second cascoded differential legs with associated positive and negative outputs with said cascoded operation biased with said bias circuitry to provide a common bias between said first and second primary cascoded transistors and said gain boost differential amplifier.

20. The differential amplifier of claim 11, wherein said gain boosted amplifier includes a differential input circuit and includes a common mode feedback circuit for controlling said bias circuitry on the input of said gain boost differential amplifier.

21. A cascoded differential amplifier, comprising:

first and second differential output legs connected between positive and negative power supply rails and each having an output;

an input differential driving circuit for receiving a differential input signal and driving said first and second differential output legs;

said first and second differential output legs having a cascoded transistor configuration with at least first and second primary cascoded transistors in each of said first and second differential output legs connected between said associated output and one of said power supply rails with said first primary cascoded transistor having the source/drain path thereof connected between said associated power supply rail and a voltage node and said second primary cascoded transistor having the source/drain path thereof connected between said voltage node and said associated output;

bias circuitry for biasing said first and second primary cascoded transistors, said first primary cascoded transistor biased to a substantially $V_{on}$ voltage level, with said substantially $V_{on}$ voltage level being substantially the $V_{on}$ voltage of said first primary cascoded transistor and said second primary cascoded transistor being gain boosted with a gain boost differential amplifier driving the gate thereof with a gain of A to multiply the output gain of the cascoded differential amplifier by the gain of A, said gain boost differential amplifier having positive and negative differential inputs with the negative input thereof connected to said voltage node and the positive input thereof connected to a voltage that is substantially identical to the voltage on said voltage node, said gain boost differential amplifier connected in a negative feedback configuration, said gain boost differential amplifier comprising:

a differential amplifier having first and second differential legs associated with positive and negative outputs, respectively, each of said first and second differential legs having one secondary transistor connected between a second voltage node and the respective output; and a differential input circuit having a differential pair of transistors of the opposite conductivity type of said at least one secondary transistor to provide the positive and negative inputs of said differential gain boost amplifier for driving said second voltage nodes on each of said first and second differential legs of said gain boost differential amplifier, with the negative one of said differential inputs connected to said first voltage node, and the positive output of said gain boost differential amplifier connected to the gate of said second primary cascoded transistor, and the negative input thereof connected to the one of said second voltage nodes associated with the negative output and wherein said at least one secondary cascoded transistor in each of said differential legs for said gain boost differential amplifier is connected to the same bias as said first primary cascoded transistor.

22. A cascoded differential amplifier for receiving a differential input signal with positive and negative differential inputs and providing positive and negative differential outputs, comprising:

primary positive and negative differential output legs connected between positive and negative power supply rails for providing the positive and negative differential outputs, respectively;

each of said primary positive and negative differential output legs having at least n-primary cascoded transistors disposed between the associated differential output and one of said positive and negative power supply rails, n being an integer;

a gain boost amplifier associated with each of said differential output legs for biasing the gate of the nth one of said n-primary cascoded transistors as determined from the one of said power supply rails in each of said differential output legs, with the input of said gain boost amplifier connected to a first voltage node between the source/drain paths of the nth and (n−1) primary cascoded transistor such that a negative feedback path is provided;

bias circuitry for biasing the n−1 primary cascoded transistors such that, with said gain boost amplifier, the voltage on said first voltage node is equal to the sum of the substantially $V_{on}$ voltages for said n−1 primary cascoded transistors; and said gain boost amplifier comprising a differential gain boost amplifier with positive and negative differential inputs and positive and negative differential outputs, said negative differential input connected to said first voltage node having a voltage output equal to the sum of the $V_{on}$ voltage of said n−1 primary cascoded transistors, said positive input of said differential gain boost amplifier connected to a reference voltage substantially equal to the sum of the $V_{on}$ voltages of said n−1 primary cascoded transistors, and the positive output of the differential gain boost amplifier connected to the gate of the nth one of the n-cascoded transistors wherein the reference voltage will also substantially track all errors in said n−1 primary cascoded transistors.

23. The differential amplifier of claim 22, wherein said differential gain boost amplifier has secondary positive and negative differential output legs with n-secondary cascoded transistors disposed therein which are substantially identical to the n-primary cascoded transistors in said primary positive and negative differential output legs, wherein the bias for said n−1 secondary cascoded transistors is substantially identical to the gate bias applied to each of said n−1 primary cascoded transistors.

24. The differential amplifier of claim 23, wherein the negative input of said differential gain boost amplifier is connected to the source/drain connection between the nth one of said cascoded transistors in the negative one of said secondary differential output legs and the n−1 secondary cascoded transistor associated therewith such that the input voltage is the sum of the $V_{on}$ voltages of the n−1 transistors.

25. A cascoded differential amplifier for receiving a differential input signal with positive and negative differential inputs and providing positive and negative differential outputs, comprising:

primary positive and negative differential output legs connected between positive and negative power supply rails for providing the positive and negative differential outputs, respectively;

each of said primary positive and negative differential output legs having at least first and second series connected cascoded transistors disposed between the associated differential output and one of said positive and negative power supply rails, such that said first cascoded transistor in each of said primary positive and negative differential output legs has one side of the source/drain path thereof connected to said one power supply rail;

a gain boosted amplifier associated with said primary positive and negative differential output legs and having first and second negative inputs and first and second positive outputs, said first negative input connected to a voltage node between the source/drain paths of said first and second cascoded transistors in said primary positive differential output leg and said second negative input connected to a voltage node between said source/drain paths of said first and said second cascoded transistors in said primary negative differential output leg, with said first positive output driving the gate of said second cascoded transistor in said primary positive differential output leg and said second positive output driving the gate of said second transistor and said primary negative output leg, said gain boosted amplifier having an internal reference which forces said voltage nodes in said primary positive and negative differential output legs to substantially the $V_{on}$ voltage for said associated first cascoded transistor; and bias circuitry for said gain boosted amplifier and said first cascoded transistors in said primary positive and negative output legs that biases said voltage nodes in said primary positive negative differential output legs to substantially the associated $V_{on}$ voltage in association with the operation of said gain boosted amplifier;

said gain boosted amplifier comprising:

first and second positive output legs for providing said first and second positive outputs to drive the gates of said second transistors in said primary positive and negative output legs, each of said first and second positive output legs having first and second cascoded transistors with the source/drain paths thereof connected in series with said associated first cascoded transistor having one side of the source/drain path thereof connected to said one power supply rail with a voltage node formed between each of said first and second cascoded transistors in each of said first and second positive output legs, a common negative output leg having first and second cascoded transistors with the source/drain paths thereof connected in series with a voltage node disposed therebetween, with said first cascoded transistor having one side of the source/drain path thereof connected to ground and a current source feeding said first and second cascoded transistors in said common negative output leg, an input driving structure for driving current into said voltage nodes associated with said first and second positive output legs and said common negative output leg, said input structure having first and second negative inputs for driving current into said voltage nodes on said first and second positive output legs inversely to the voltage on said voltage nodes on said primary positive and negative differential output legs respectively, said input structure having a common positive input for driving current into said voltage node on said common negative output leg inversely to the voltage thereon, the voltage thereon substantially equal to the voltage on said voltage node associated with said primary positive and negative output legs, and said bias circuitry for biasing said first transistors in said first and second positive output legs and said common negative output leg in addition to said first transistors in said primary positive and negative output legs.

26. The cascoded differential amplifier of claim 25, wherein said common positive input comprises a transistor of opposite type to said first transistors in said common output leg with the gate thereof connected to said voltage node in said common negative output leg.

* * * * *